United States Patent [19]

Whikehart et al.

[11] Patent Number: 5,490,173
[45] Date of Patent: Feb. 6, 1996

[54] MULTI-STAGE DIGITAL RF TRANSLATOR

[75] Inventors: J. William Whikehart, Novi; James A. Wargnier, Harrison Township, both of Mich.

[73] Assignee: Ford Motor Company, Dearborn, Mich.

[21] Appl. No.: 84,903

[22] Filed: Jul. 2, 1993

[51] Int. Cl.[6] .................................................. H04L 27/06
[52] U.S. Cl. ........................ 375/316; 375/350; 370/70; 364/724.1
[58] Field of Search .................................. 375/316, 324, 375/328, 340, 343–345, 350; 364/724.1, 724.13; 329/315, 318; 455/307; 370/70

[56] References Cited

U.S. PATENT DOCUMENTS

| | | | |
|---|---|---|---|
| 4,406,019 | 9/1983 | Ide et al. | 455/307 |
| 4,592,074 | 5/1986 | Whikehart | 375/316 |
| 4,737,728 | 4/1988 | Nakamura et al. | 375/328 |
| 5,148,452 | 9/1992 | Kennedy et al. | 375/343 |
| 5,220,557 | 6/1993 | Kelley | 370/50 |
| 5,220,583 | 6/1993 | Solomon | 375/328 |
| 5,222,144 | 6/1993 | Whikehart | 375/261 |
| 5,278,837 | 1/1994 | Kelley | 370/120 |
| 5,357,544 | 10/1994 | Horner et al. | 375/340 |

FOREIGN PATENT DOCUMENTS

| | | |
|---|---|---|
| 0254844 | 2/1988 | European Pat. Off. . |
| 2114840 | 8/1983 | United Kingdom . |
| WO-A-8605936 | 10/1986 | WIPO . |
| WO-A-8707099 | 11/1987 | WIPO . |

OTHER PUBLICATIONS

*Principles of Sigma–Delta Modulation for Analog-to-Digital Converters*, Sangil Park, Ph.D., Motorola, Inc., 1990, pp. 1–13 and 25–30.
*Multirate Filter Designs Using Comb Filters*, Shuni Chu and C. Sidney Burrus. IEEE Transactions on Circuits and Systems, vol. CAS–31, No. 11, Nov. 1984, pp. 913–924.
*HSP50016 Digital Down Converter*, Preliminary Product Literature, Sep. 1992, Harris Semiconductor, pp. 1–36.

Primary Examiner—Young Tse
Attorney, Agent, or Firm—Roger L. May; Mark Mollon

[57] ABSTRACT

An apparatus for performing digital signal frequency translation in a digital receiver is disclosed. The apparatus uses a plurality of mixer-filter-decimator stages for performing the digital signal frequency translation. The translation function converts the digital signal to an intermediate frequency (IF), where such translation is distributed among the plurality of mixer-filter-decimator stages to thereby simplify the mixing requirements.

5 Claims, 5 Drawing Sheets

MULTI-STAGE DIGITAL RF TRANSLATOR

BACKGROUND OF THE INVENTION

1. Field of the Invention

The present invention relates generally to IF conversion, and more specifically to a multi-stage digital RF translator for performing IF conversion.

2. Related Art

Modern communications receivers range from simple FM-stereo radios to more complex, high-bandwidth communications receivers such as those used for satellite communications. These receivers can be implemented using entirely analog technology, or portions of the receiver can be implemented using digital solutions.

The typical analog FM receiver, for example, mixes an incoming FM signal with a variable injection frequency so that the desired channel is positioned at a desired IF (intermediate frequency). This mixing is often termed a frequency conversion or a frequency translation. In more advanced solutions, multiple frequency conversions may be performed to detect the desired frequency. In these advanced receivers, the first conversion is typically performed using a variable injection frequency, while the subsequent conversions use a fixed injection frequency.

With the advent of digital technology, there has been a trend in communications technology to implement a variety of receiver functions using digital circuits. Rapid advances in solid-state and digital-signal-processing technologies have furthered efforts to digitize communications receivers.

One conventional solution implementing digital circuits digitizes the received signal and performs a quadrature mix of the digitized signal to convert it directly to nominally 0 Hz IF. This mixing technique uses digital multipliers that are fed by high speed oscillators to provide sine and cosine injection signals. The mixing is followed by one or more stages of filtering and decimation to isolate the desired receive channel. One or more of the filtering stages may be implemented using simple multiplierless filters for ease of implementation in high speed applications.

A problem with this conventional solution is that the sine and cosine signals injected at the mixer must be generated at very high frequencies (e.g., 88 to 108 MHz for a broadcast FM receiver) to obtain proper conversion results. Generating these signals can be costly and requires a large amount of integrated circuit area.

What is needed is a digital receiver solution that allows digitization and channel isolation in the digital signal processing (DSP) domain of high-frequency receive signals without requiring high-speed DSP oscillators for mixer injection signals, while at the same time using simple high-speed multiplierless filters.

SUMMARY OF THE INVENTION

The present invention is a multi-stage digital RF translator for use in a digital receiver. The multi-stage digital RF translator comprises multiple mixer-filter-decimator (MFD) stages. Each stage includes a mixer for performing an IF conversion, a filter for performing a low pass filtering operation to prevent aliasing, and a decimator to resample the data at a lower rate. As a result, instead of providing a single, complex, high-frequency mixer, the mixing operation is distributed throughout the multiple MFD stages each operating at a different rate. This allows the mixing operation to be simplified, resulting in an easier and less costly implementation.

According to the invention, the first stage is a half-complex mixer. Subsequent stages are implemented using a full complex mixer. Each mixer provides an output signal proportional to the product of the instantaneous values of the complex input signals. The mixer in each stage is implemented such that the injection signal has a frequency that is ¼ the sample rate of the stage. As a result, the injection signals can always be chosen as $\cos(K\pi/2)$ or $\sin(K\pi/2)$ where K is an integer indicating the sample number in time. In other words, the injection signal values can be chosen as a 1, a 0, or a −1. Because the injection signals are limited to these values, multipliers are not needed to implement the mixing function. Instead, the mixing function can be implemented using multiplexing, passing and negation operations.

Once the signal is converted to a lower frequency by the mixer, it is fed into a filter. In a preferred embodiment, the filter is a cascade of simple filter sections that implement a low pass filter. The low pass filter attenuates high frequency components of the signal to prevent aliasing in the decimation stage.

The output of the low pass filter is provided to the decimator where the data is sampled so that one out of N filter output words is provided as an output signal of the decimator.

In a preferred embodiment, each filter section is a two-tap comb FIR (finite-impulse-response) filter, which is well known in the art.

Distributing the mixing function throughout each MFD stage allows the translator to operate in a manner analogous to successive approximation. The first stage provides a coarse mixing followed by the filtering and decimation functions. Each successive stage brings the signal closer and closer to the desired intermediate frequency (IF) of nominally 0 Hz. Because the mixing is performed in stages, it is less complex than would be required in conventional systems using a single mixer followed by multiple filtering and decimation stages.

Further features and advantages of the present invention, as well as the structure and operation of various embodiments of the present invention, are described in detail below with reference to the accompanying drawings.

BRIEF DESCRIPTION OF THE DRAWINGS

The present invention will be described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE INVENTION

Figure 1:
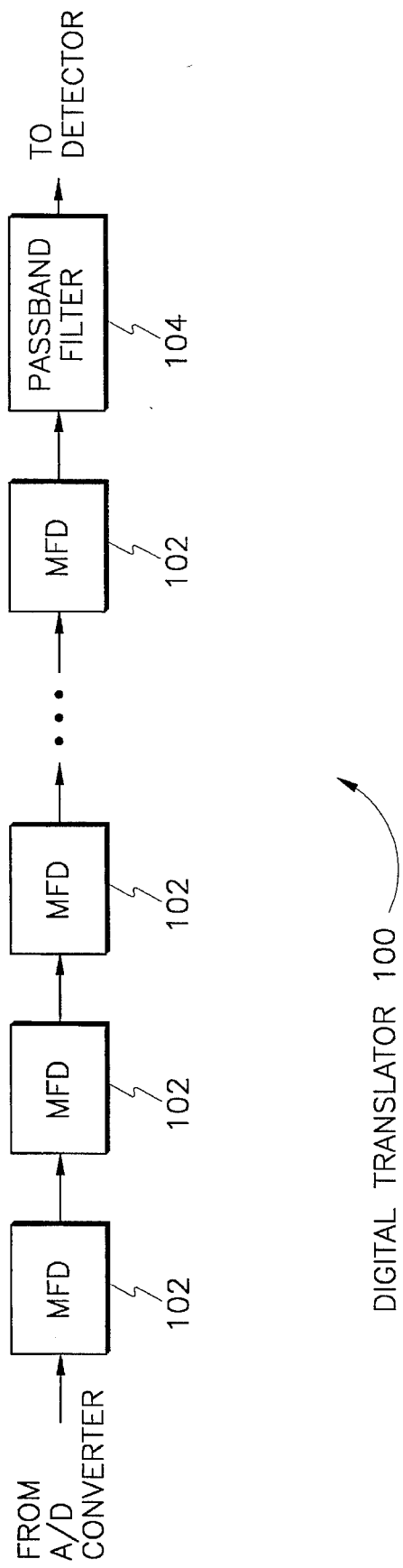
FIG. 1 is a block diagram illustrating a digital translator according to the present invention implemented using multiple mixer-filter-decimator stages.

The present invention is a digital translator circuit that includes multiple mixer-filter-decimator (MFD) stages. As a result, the mixing operation is distributed throughout multiple filter-decimator stages. This is illustrated by the block diagram of FIG. 1. Referring now to FIG. 1, a digital translator 100 is illustrated as including multiple MFD stages 102. Also included is a passband filter 104 as a final stage. Passband filter 104 provides ripple correction.

Figure 5:
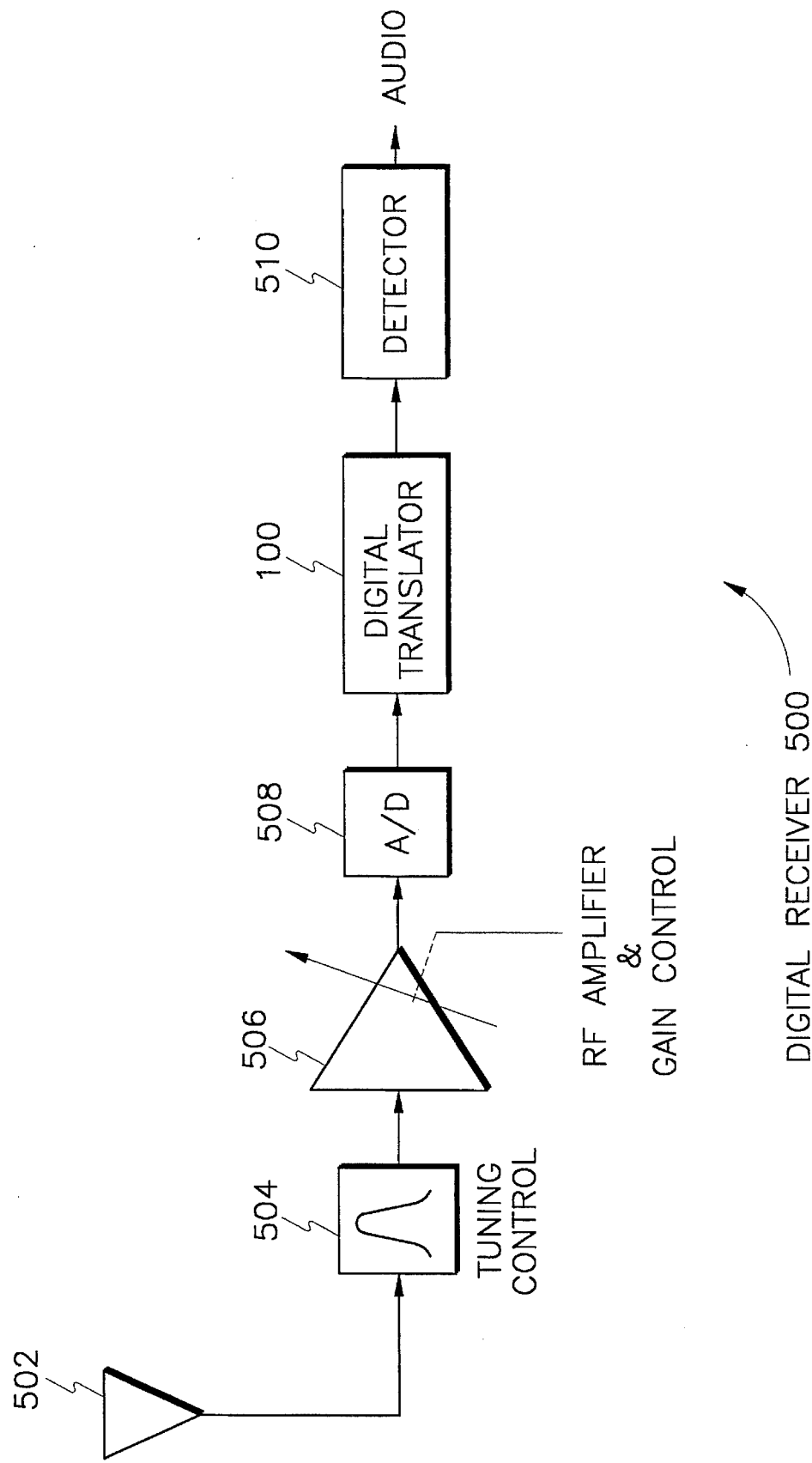
FIG. 5 is a block diagram illustrating a digital receiver using the digital RF translator according to the present invention.

FIG. 5 is a block diagram illustrating a digital receiver 500. Digital receiver 500 is an example environment in which digital translator 100 according to the present invention can be implemented. Referring now to FIG. 5, an antenna 502 receives a band of input frequencies. Tuning control 504 is used to partially select a desired channel from the band received by antenna 502. An RF amplifier 506 increases the level of the signal from the antenna. Typically, the amount of amplification introduced by RF amplifier 506 is set by the designer, and often automatic gain control is provided. An analog to digital (A/D) converter converts the amplified signal to a digital data stream representing the amplified signal.

Digital translator 100, operating as described below, translates the digital signal to a nominally 0 Hz IF (baseband) for further signal processing. The purpose of such frequency translation is to provide a lower IF frequency, thus facilitating subsequent digital processing. The output of digital translator 100 is fed to a detector 510 which converts the signal to an audio signal. The signal is then provided to audio frequency amplifiers (not shown) and a speaker.

As noted above, digital translator 100 includes multiple MFD stages 102. Each stage includes a mixing, filtering, and decimation function. Because of this unique design, the mixing function is distributed throughout multiple MFD stages 102 and is thereby simplified for ease of implementation.

Figure 2:
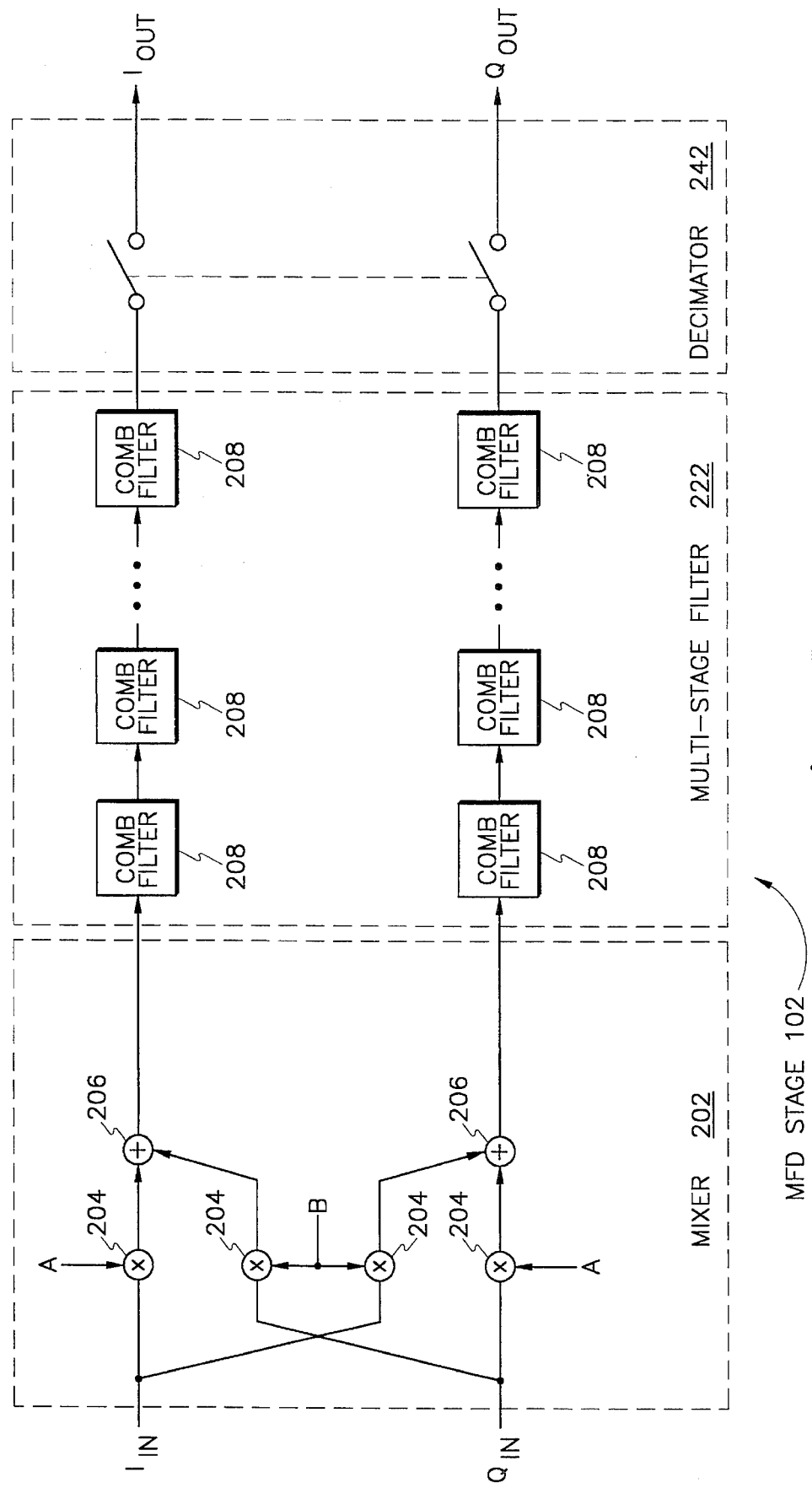
FIG. 2 is a block diagram illustrating an example implementation of a mixer-filter-decimator stage.
Figure 3:
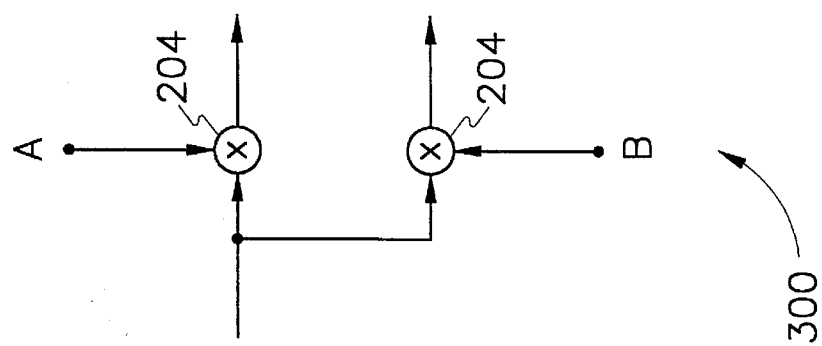
FIG. 3 is a diagram illustrating a half-complex mixer.

FIG. 2 illustrates an example implementation of an MFD stage 102. Each MFD stage 102 includes a mixer 202, a filter 222, and a decimator 242. Referring now to FIG. 2, mixer 202 is illustrated as a full-complex mixer. In a preferred embodiment, mixer 202 is actually a half-complex mixer for the first MFD stage 102 and a full-complex mixer for each subsequent MFD stage 102. A half-complex mixer 300 is illustrated in FIG. 3.

A full complex mixer 202 accepts two input signals $I_{in}$ and $Q_{in}$. $I_{in}$ and $Q_{in}$ are a complex pair of signals that together represent a complex signal $I+jQ$. $I_{in}$ is the in-phase (real part) signal, while $Q_{in}$ is the quadrature phase (imaginary part) signal.

The injection signal for full-complex mixer 202 is also a complex signal and can be represented by $\cos+j\sin$. Reference character A is the cosine component and Reference character B illustrates the sine component. In other words, the injection signal can be written as $A+jB$.

Digital mixer 202 can be thought of as a complex signal multiplier. The instantaneous value of the output of mixer 202 is proportional to the product of the instantaneous values of the two inputs. Mixer 202 is configured as illustrated with multipliers 204 and adders 206 to perform complex multiplication. Full complex multipliers such as the one illustrated in FIG. 2 are well known to persons of skill in the relevant art.

Mixer 202 is implemented such that the injection signal can be chosen with a frequency of $+f_s/4$, $-f_s/4$, or 0 where $f_s$ is the sample rate of the stage. Thus, the values of the injection signals A, B, can always be chosen as 1, 0, or −1. For example, for $+f_s/4$ the sequence of values for the cosine signal is $\cos(0)=1$, $\cos(\pi/2)=0$, $\cos(\pi)=-1$, and $\cos(3\pi/2)=0$. As a result, multipliers are not needed to implement mixer 202. Mixer 202 can be implemented using multiplexing, passing and negation operations. These simple operations are much easier to perform at higher speeds than actual multiplication.

For a particular receive channel, in each stage it is determined which of the possible injection frequencies ($+f_s/4$, $-f_s/4$, or 0), if chosen, would bring the signal center frequency closest to 0 Hz. For each channel, there is a particular mix of frequencies to pull the signal center frequency closest to 0 Hz. These frequencies can be predetermined and the control for the mixers can be stored in a table for micro-controller execution.

Because the first MFD stage 102 is fed from A/D converter 508, the input signal at the first stage has no imaginary component. Thus, the first stage only requires a half-complex mixer 300 as illustrated in FIG. 3.

An example of mixer 202 is fully discussed in U.S. Pat. No. 4,592,074 to Whikehart which is incorporated herein by reference.

The next part in each MFD stage 102 is a filter 222. The purpose of filter 222 is to filter out noise that could be aliased back into the baseband during decimation. In addition, in the first MFD stage 102, filter 222 removes an undesired mixing image from the signal received from mixer 202. In a preferred embodiment, filter 222 stage is a multi-stage comb filter 222. A comb filter 222 is selected because it is one of the easiest and most economical filters to implement.

The filter 222 and mixer 202 for each MFD stage 102 are selected so that the mix places the desired channel passband within the low pass bandwidth of filter 222.

Each comb filter is a FIR filter with M coefficients, all equal to 1. The transfer function of the comb filter can be expressed as:

$$H(z) = 1 + z^{-1} + \ldots + z^{-(M-1)} = \frac{Y(z)}{X(z)} \quad (1)$$

Filter 222 is followed by an N:1 decimator 242 (2:1 in a preferred embodiment). Decimator 242 samples the data output from filter 222 such that the data rate is reduced by a factor of N. Thus, decimator 242 provides data output at a lower rate. The output of decimator 242 is at the lower rate of $f_s/N$, where N=2 for a 2:1 decimator.

A single-stage comb filter may not have enough attenuation in the region of interest to prevent aliasing in the decimation stage. To provide the necessary attenuation filter 222 can be implemented using multiple, cascaded comb filters 208 as shown in FIG. 2.

Figure 6:
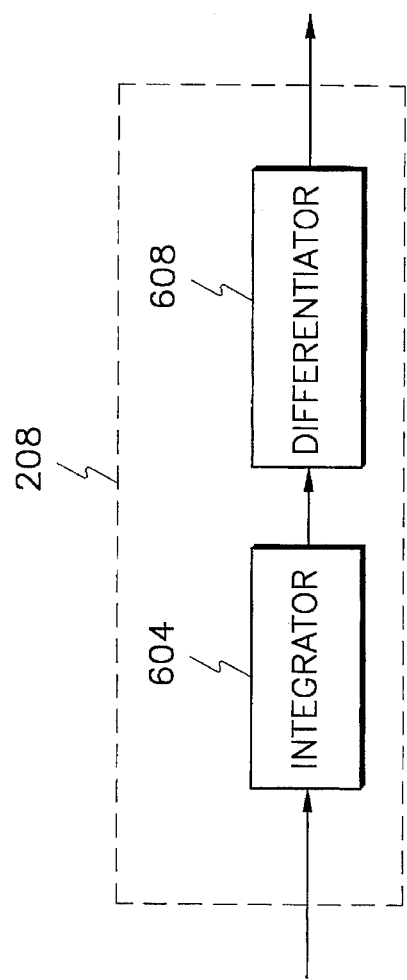
FIG. 6 is a diagram illustrating a filter comprising a differentiator and an integrator.
Figure 7:
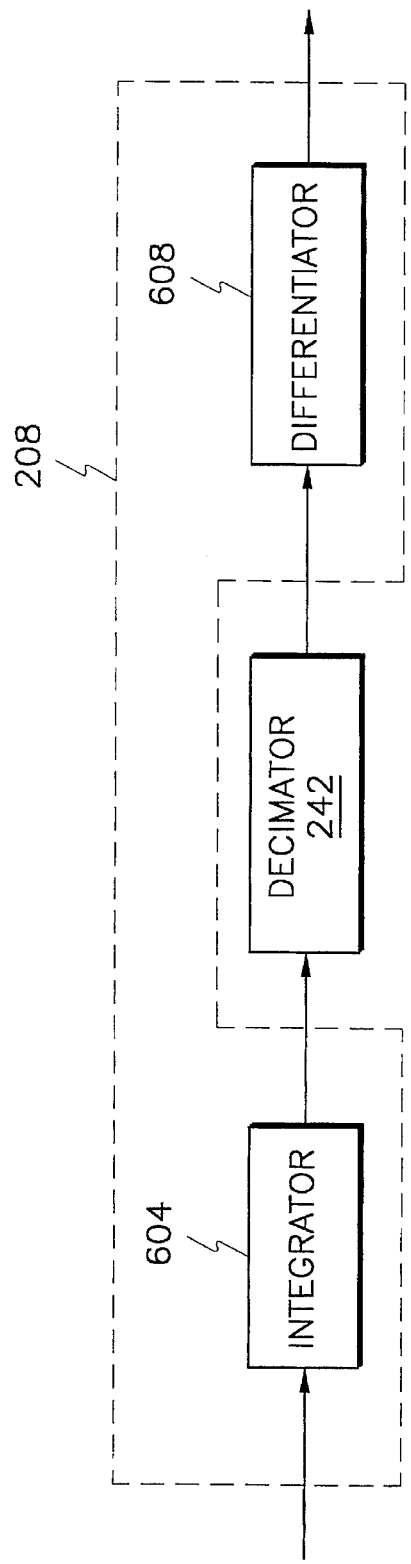
FIG. 7 is a diagram illustrating a filter having integration and differentiation stages, where the differentiation is performed after decimation.

Because filter 222 can be separated into integration 604 and differentiation 608, as illustrated in FIG. 6, is an alternative embodiment, the differentiation 608 operation can be performed after decimation as illustrated in FIG. 7. Thus, the differentiation 608 can be performed at the lower data rate.

A passband ripple correction filter 104 is implemented to flatten the passband by removing ripple introduced by the filters. In a preferred embodiment, passband filter 104 is an FIR filter.

Figure 4:
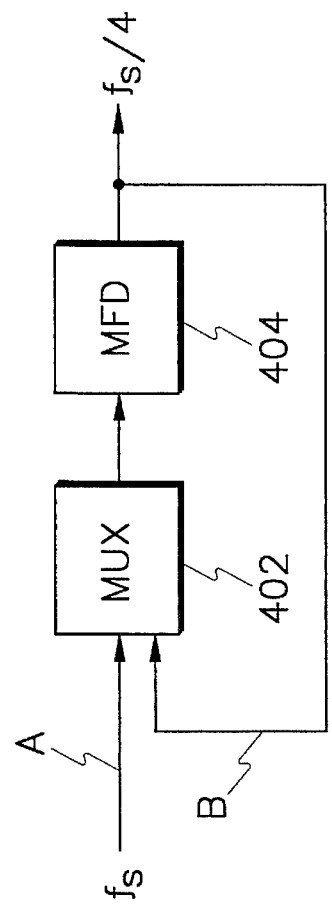
FIG. 4 is a block diagram illustrating how a multiplexer could be used with a single mixer-filter-decimator to provide multiple mixer-filter-decimator stages.

FIG. 4 illustrates a manner by which two or more of the MFD stages 102 can be implemented using a single, common MFD 404 and a multiplexer 402. According to this implementation, when the circuit is functioning as the first stage of the two or more MFD stages 102, multiplexer 402 is controlled to select input signal A which is the input signal to the first of the two or more stages. When functioning as subsequent stages, multiplexer 402 selects input signal B from the output. In this manner, a single MFD 404 can be used to implement multiple MFD stages 102. Note that because each stage reduces the sample rate by a factor of N, common MFD 404 only needs to execute each stage at a rate not greater than N times the rate of the fastest included stage.

MFD 102 includes storage elements to store intermediate values. MFD 404 is different from MFD stages 102 in that MFD 404 includes additional storage elements to store intermediate values for all stages implemented by MFD 404. Also included in MFD 404 is storage selection circuitry.

Distributing the mixing phase (mixer 202) over multiple MFD stages 102 allows the mixing operation to be simplified. The mixing in multiple stages can be analogized to successive approximation techniques used in analog-to-digital converters, where a first, coarse calculation is performed and then refined in subsequent stages. According to the invention, in the first MFD stage 102, a very coarse mix is performed to allow the signal to be filtered and decimated by a factor of two (2). In other words, the input signal is pulled close enough to the desired IF frequency so the right amount of filtering can be implemented to enable decimation without aliasing. Each subsequent stage continues in this manner until the desired IF of nominally 0 Hz is reached. Distributing the mixing in this manner lessens the net complexity required for the frequency conversion.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An apparatus for performing digital signal frequency translation, comprising:

a mixer-filter-decimator stage comprising mixing means for translating a digital signal to an intermediate frequency signal, filter means for low-pass filtering said intermediate frequency signal and decimation means for lowering a rate of said filtered intermediate frequency signal; and multiplexing means having an output coupled to said mixing means and an input coupled to said decimation means for implementing a multi-stage digital frequency translator using a single mixer-filter-decimator stage.

2. The apparatus of claim 1, further comprising a passband filter coupled to said decimation means to provide passband ripple correction.

3. A digital receiver, comprising an RF amplifier configured to receive and amplify an RF signal from an antenna;

an analog-to-digital converter configured to convert said amplified RF signal to a digital signal;

a mixer-filter-decimator stage comprising mixing means for translating said digital signal to an intermediate frequency signal, filter means for low-pass filtering said intermediate frequency signal and decimation means for lowering a rate of said filtered intermediate frequency signal; and multiplexing means having an output coupled to said mixing means and an input coupled to said decimation means for implementing a multi-stage digital frequency translator using a single mixer-filter-decimator stage.

4. The receiver of claim 3, further comprising tuning means coupled between said antenna and said RF amplifier for selecting a carrier frequency from said RF signal.

5. The receiver of claim 3, further comprising a passband filter coupled to said decimation means to provide passband ripple correction.

\* \* \* \* \*